(12) United States Patent
Chou (10) Patent No.: US 6,437,396 B1
(45) Date of Patent: Aug. 20, 2002

(54) NONVOLATILE MEMORY (75) Inventor: Kuo-Yu Chou, Hsinchu (TW)

(73) Assignee: Winbond Electronics Corporation (TW)

( * ) Notice: Subject to any disclaimer, the term of this patent is extended or adjusted under 35 U.S.C. 154(b) by 0 days.

(21) Appl. No.: 09/197,064

(22) Filed: Nov. 20, 1998

(30) Foreign Application Priority Data

Jul. 22, 1998 (CN) .......................................... 87111973 A (51) Int. Cl.[7] .............................................. H01L 29/788
(52) U.S. Cl. ........................ 257/316; 257/321; 257/324
(58) Field of Search ................................. 257/324, 316, 257/321, 322

(56) References Cited

U.S. PATENT DOCUMENTS

| 5,122,847 A | * | 6/1992 | Kamiya et al. | ............. 357/23.5 |
| 5,138,410 A | * | 8/1992 | Takebuchi | .................. 357/23.5 |
| 5,838,041 A | * | 11/1998 | Sakagami et al. | ........... 257/324 |
| 5,946,240 A | * | 8/1999 | Hisamune | ............... 365/185.28 |
| 6,166,410 A | * | 12/2000 | Lin et al. | ..................... 257/324 |

FOREIGN PATENT DOCUMENTS

JP          10-125811       *    5/1998

* cited by examiner

*Primary Examiner*—Sara Crane
(74) *Attorney, Agent, or Firm*—Peter F. Corless; Edwards & Angell, LLP (57) ABSTRACT

A structure and a process of a nonvolatile memory are provided. By forming a oxide/nitride/oxide (ONO) layer in a floating gate thin oxide (FLOTOX) memory, the same data can be programmed in one nonvolatile memory to guarantee the reliability but without using two nonvolatile memories. Besides, people can program different data separately to achieve the purpose of multi-state memory.

12 Claims, 8 Drawing Sheets

NONVOLATILE MEMORY

FIELD OF THE INVENTION

The present invention relates to a structure and a process of a nonvolatile memory, especially to a nonvolatile memory having a high reliability and a small size.

BACKGROUND OF THE INVENTION

Figure 1:
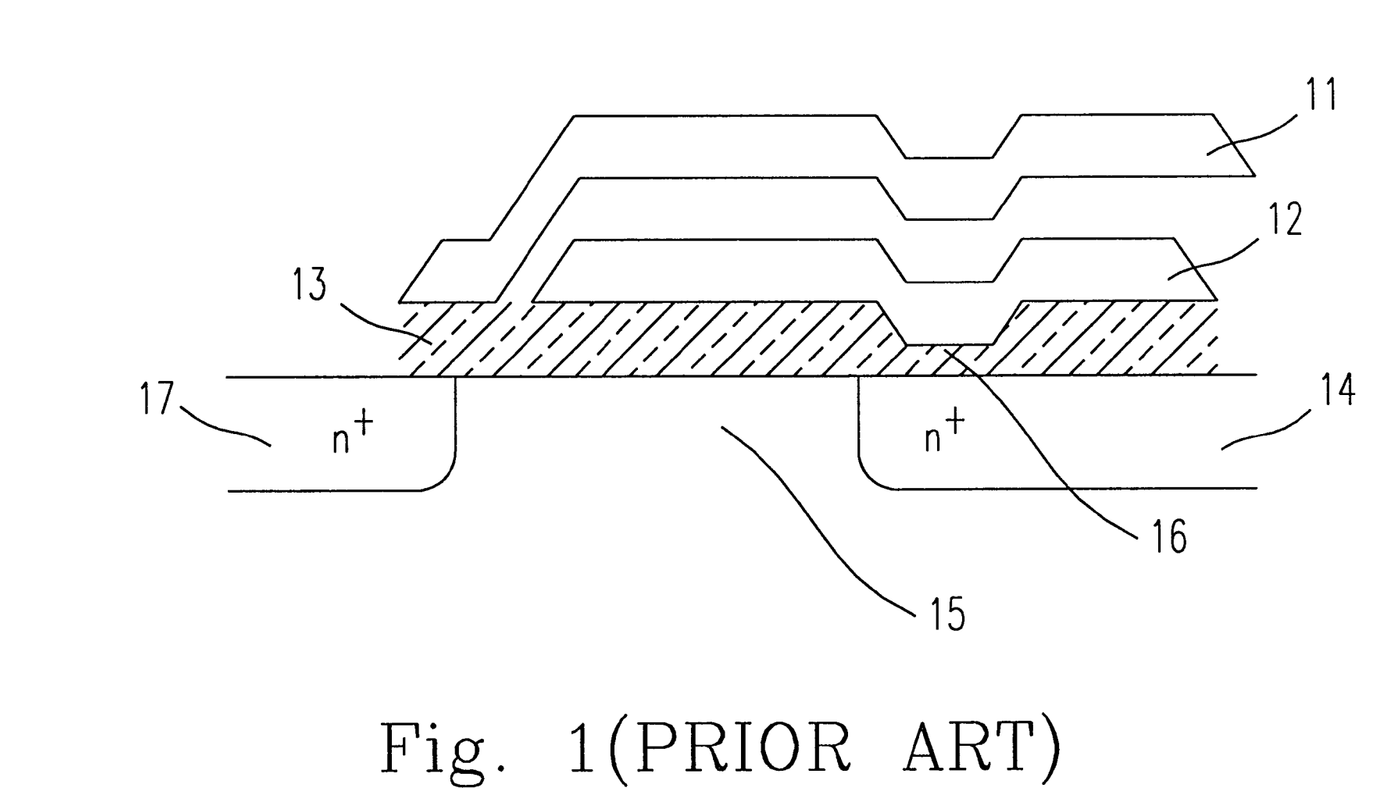
FIG. 1 schematically shows a of conventional nonvolatile memory.

The applications of nonvolatile memories have become more and more popular, such as electrically erasable programmable read only memory (EEPROM) and flash memory. The nonvolatile memory can memorize a data even when the power is shut down. In the early time, there are two types of nonvolatile memories developed, the floating gate type and the charge trapping type. Both of them have two or three layers isolated layers to store electrons. Both of them have two or three layers of isolation layers to retain the charge Please refer to FIG. 1 which is a common floating gate thin oxide memory (FLOTOX). A voltage is applied between the control gate 11 and the drain 14 to enable the oxide layer to generate the Fowler-Nordheim (F-N) tunneling effect. The electronic tunnel from the drain 14 to the floating gate 12 through the tunneling oxide 16 can increase the threshold voltage and erase data at the same time. On the other hand, the electrons in the floating gate 12 can tunnel to the drain 14 through the tunneling oxide 16 for decreasing the threshold voltage and programming data.

Figure 2:
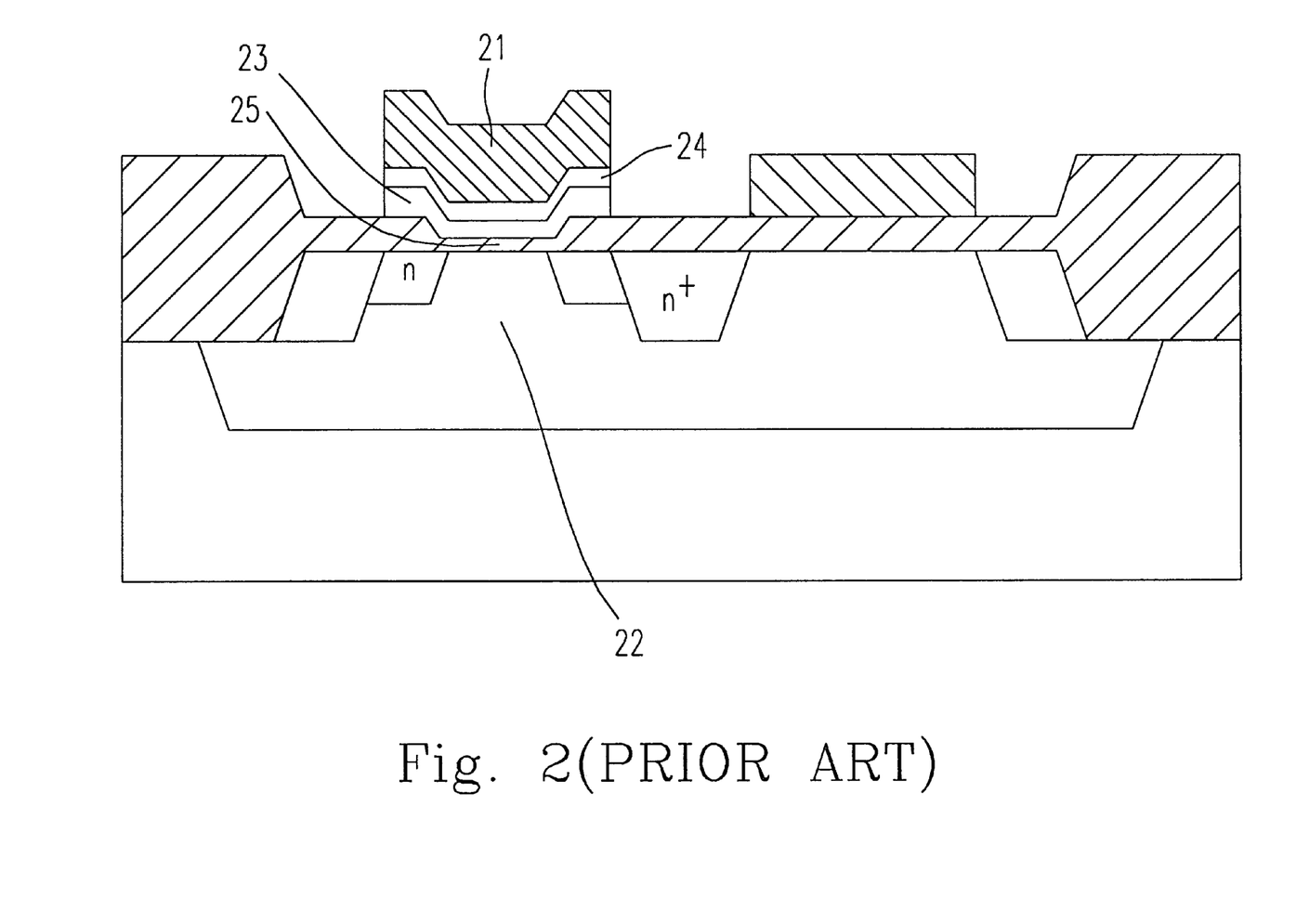
FIG. 2 schematically shows another conventional nonvolatile memory.

Please refer to FIG. 2 which is a charge trapping type memory (or a semicondutor/oxide/nitride/oxide/ semiconductor memory (SONOS)). There are two oxide layers 24, 25 and one nitride layer 23 below the gate 21. A high voltage is applied between the gate 21 and the well 22, the electrons are trapped by the nitride layer 23 from the well 22 for programming. On the other hand, for erasure, a high voltage is applied to the well 22 and the gate 21 is connected to ground to enable the holes to be injected into the nitride layer 23 to neutralize the electricity.

Figure 3:
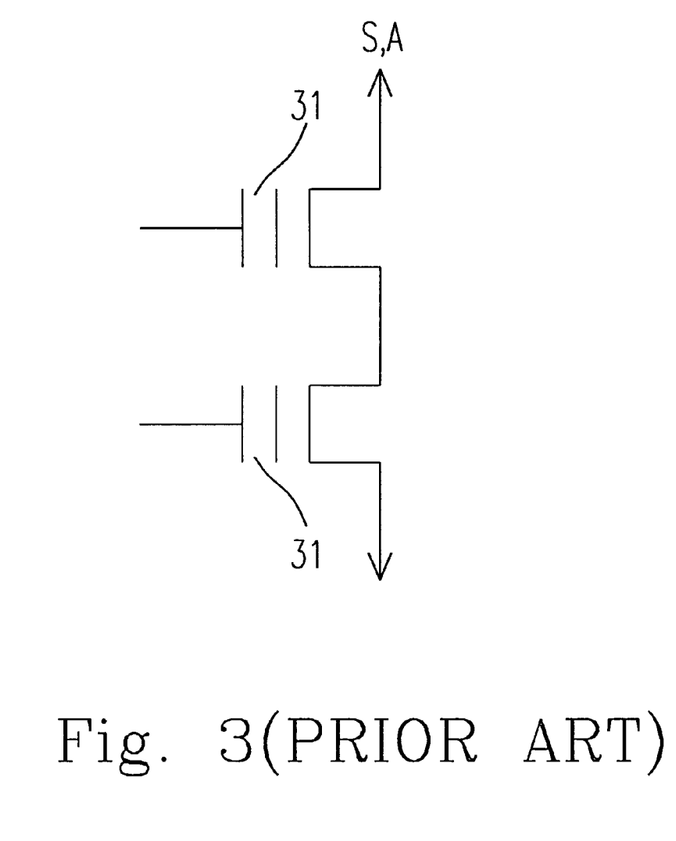
FIG. 3 is a circuit of a "Q-cell"

However, the whole nonvolatile memory is failed as long as any one cell in the memory is failed. That is to say, if any one cell in a memory can not attain the standard of retention time or endurance, the whole memory is failed and the data will be missed. The main reason of the failure of a memory is associated with the quality of the tunneling oxide. If the quality of the tunneling oxide is poor or there are some defects inside, the floating gate can not retain the charge, resulting in a data loss. Instead, more than one memories are used to retain an information. Please refer to FIG. 3 showing a "Q-cell" as an example. It consists of two memory units in series. Unless both of the two memories 31 are failed, the data is still correct. However, although it can increase the precision of information, it needs a bigger cell size.

The main concern of the present invention is to provide a nonvolatile memory having a high reliability and a small size.

SUMMARY OF THE INVENTION

The first object of the present invention is to provide a nonvolatile memory which has a broad write/erase threshold voltage window.

The second object of the present invention is to extend the retention time and the endurance of a nonvolatile memory.

The third object of the present invention is to improve the reliability and reduce the size of a nonvolatile memory.

The fourth object of the present invention is to improve the anti-radiation ability of a nonvolatile memory.

The fifth object of the present invention is to provide a simple process for manufacturing a nonvolatile memory, which is similar to that of the traditional FLOTOX.

According to the present invention, the nonvolatile memory includes a substrate, a memory unit formed on the substrate, a floating gate formed on the memory unit, and a control gate formed on the floating gate.

In an embodiment of the present invention, the memory unit is a composite dielectric layer or an oxide/nitride/oxide (ONO) layer. The ONO layer further includes a first oxide layer formed on said substrate, a nitride layer formed on the first oxide layer, and a second oxide layer formed on the nitride layer. The thickness of the first oxide layer, the nitride layer, and the second oxide layer are in the range of 20~60Å, 20~100Å, and 20~500Å respectively. Besides, the ONO layer can memorize a digital data by injecting electrons therein and erase the memorized data by injecting holes therein. The nonvolatile memory further includes a dielectric layer between the floating gate and the control gate. Moreover, the substrate has a drain and a source and there is a channel formed between them. The memory unit is between the floating gate and the channel.

In an embodiment of the present invention, an ONO layer is setting inside a FLOTOX memory. The threshold voltages for tunneling electrons or holes to FLOTOX and ONO layer are different and have a broad range. The ONO layer and the FLOTOX can be controlled separately by providing different voltages to achieve the purpose of multi-state memory. The ONO layer and the FLOTOX also can be program the same data to ensure the reliability with a small size.

Another object of the present inventions to provide a process for producing a nonvolatile memory. The process includes the steps of providing a substrate, forming a memory unit on the substrate, forming a floating gate on the memory unit, and forming a control gate on the floating gate.

The steps of forming the ONO layer include: (1) forming a first oxide layer on the substrate, (2) forming a nitride layer on the first oxide layer, and (3) forming a second oxide layer on the nitride layer. The process further includes a step of forming a dielectric layer before the control gate is formed. In addition, the process further includes a step of doping the substrate to form a drain and a source after the substrate is provided.

The present invention may best be understood through the following description with reference to the accompanying drawings, in which:

DETAILED DESCRIPTION OF THE PREFERRED EMBODIMENTS

Figure 4:
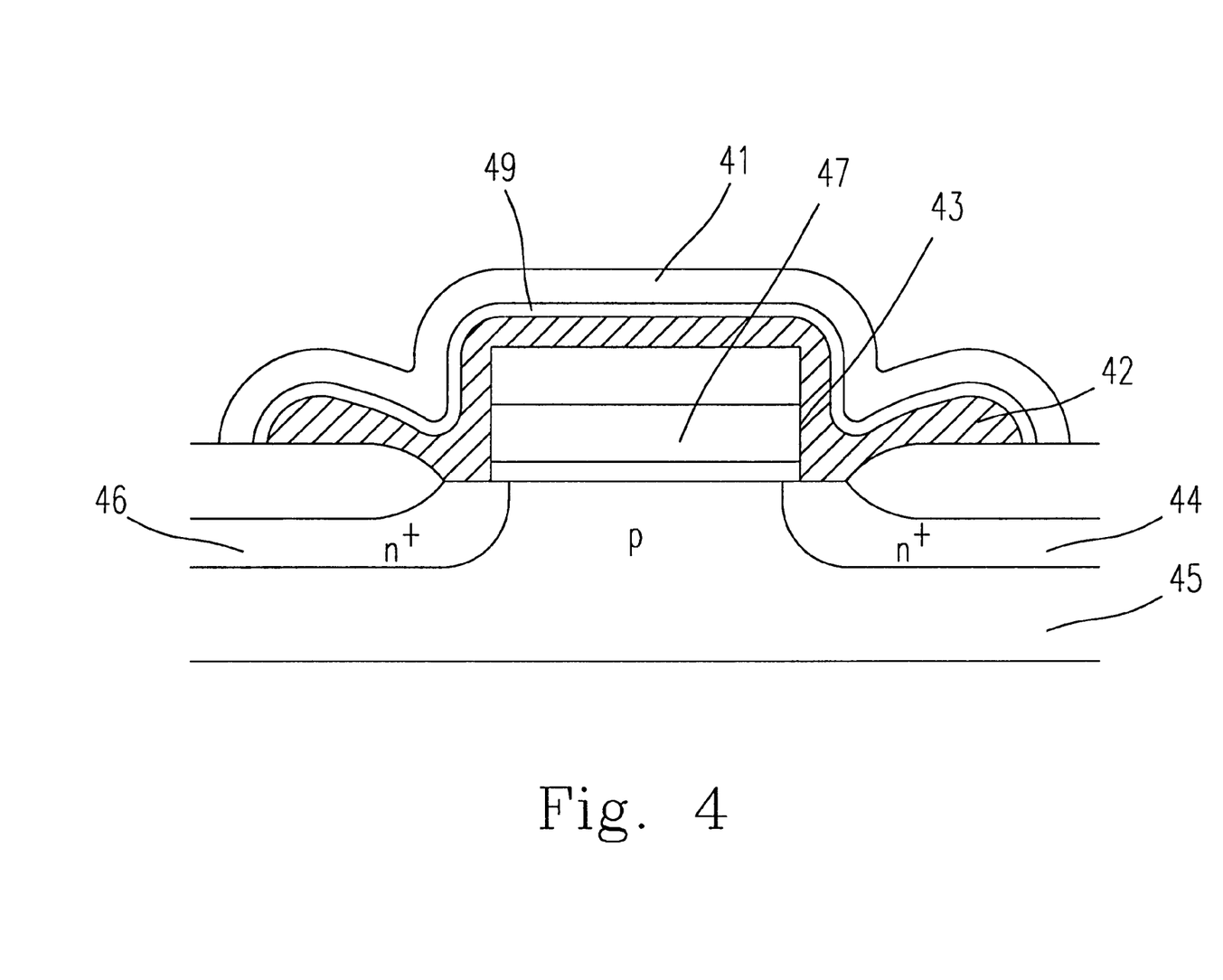
FIG. 4 schematically shows a preferred embodiment of a nonvolatile memory according to the present invention.

Please refer to FIG. 4 which is a preferred embodiment of a nonvolatile memory according to the present invention. This is a combination of a traditional FLOTOX memory and a SONOS memory. The oxide/nitride/oxide (ONO) layer 43 is formed on the channel of substrate 45 between the drain 44 and the source 46. The ONO layer 43 is a memory unit as a part of the SONOS memory as shown in FIG. 2. In addition, the floating gate 42 is formed over the ONO layer 43, the drain 44 and the source 46. Then, the dielectric layer 49 and the control gate 41 are formed on the floating gate 42 in sequence. By injecting electrons or holes into the nitride layer 47 and floating gate 42, a data can be programmed or erased. Therefore, by applying different voltages to the ONO layer and the FLOTOX, the same data can be programmed in one nonvolatile memory to improve the reliability without using two nonvolatile memory. Different data can also be programmed separately to achieve the purpose of multi-state memory.

Figure 5:
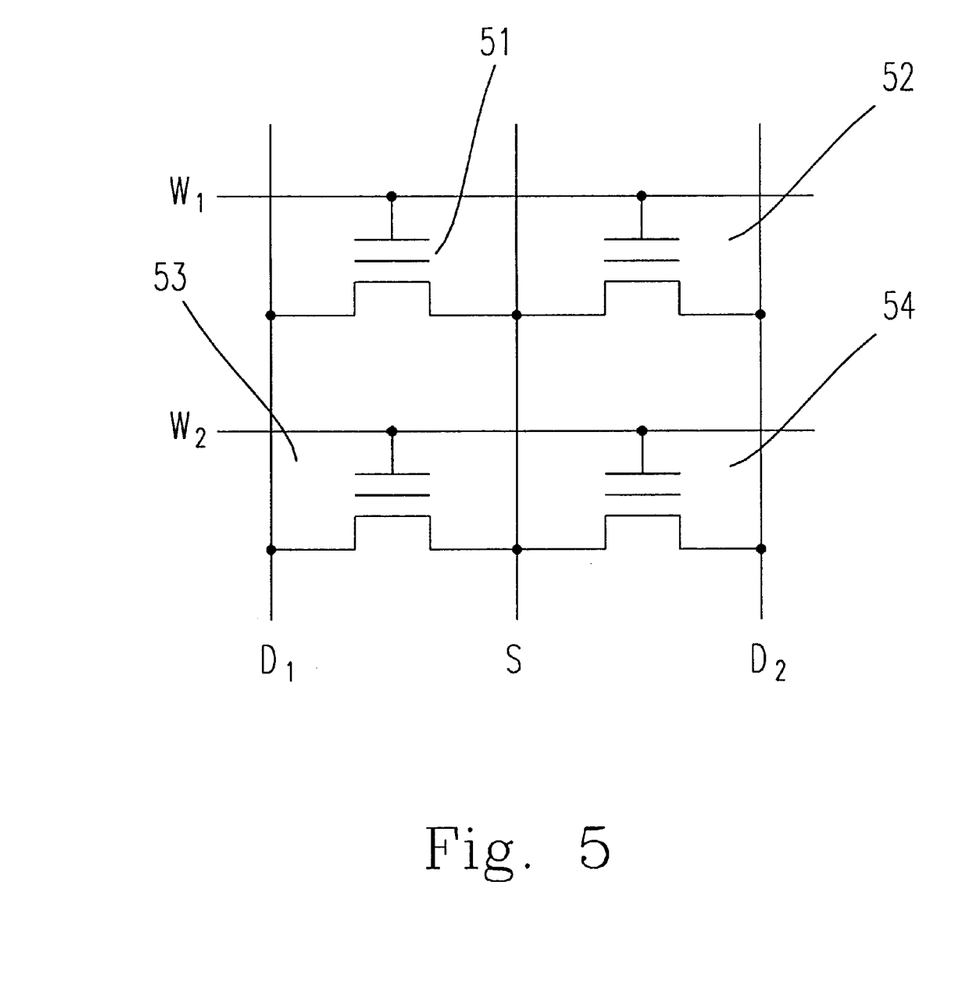
FIG. 5 is a circuit in accordance with Table 1.
Figure 6A:
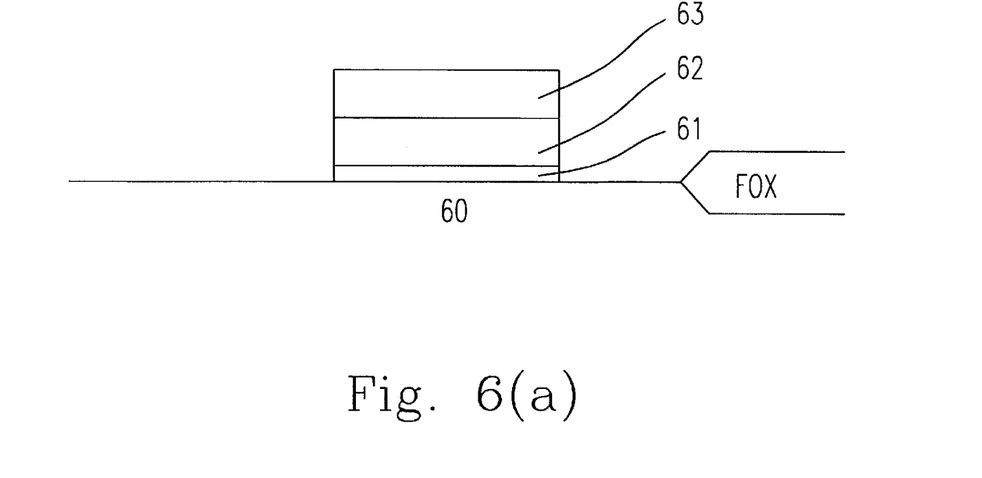
FIG. 6 schematically shows a preferred embodiment of a process for producing a nonvolatile memory according to the present invention.
Figure 6B:
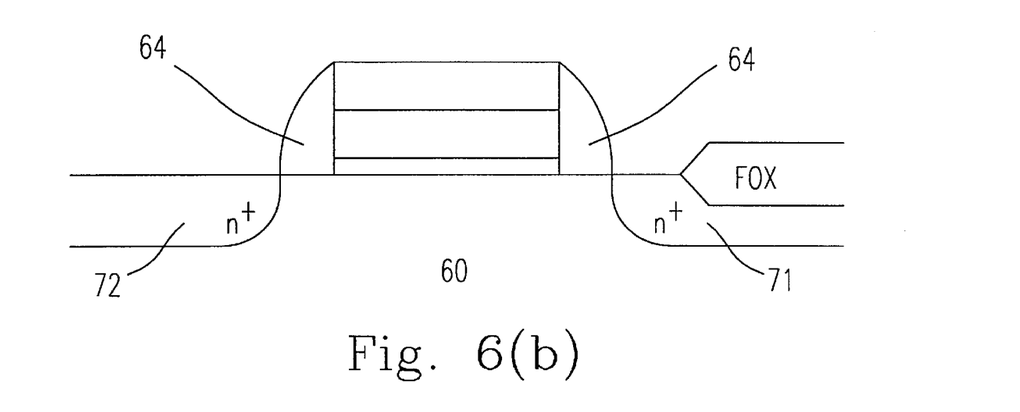
Figure 6C:
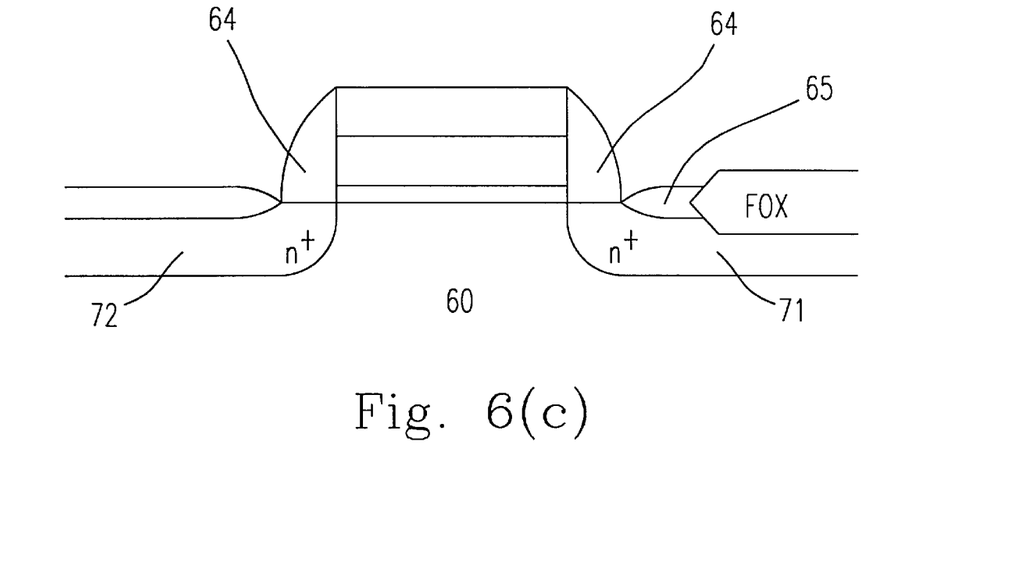
Figure 6D:
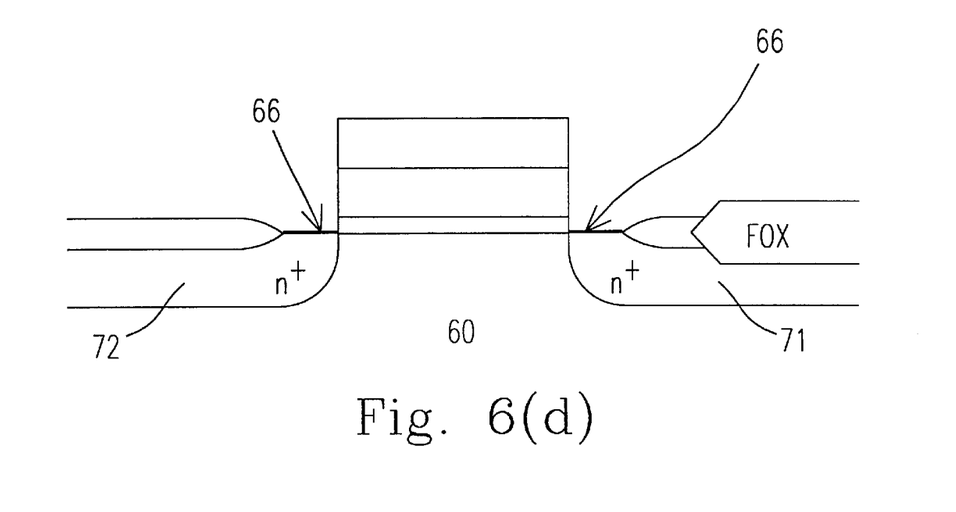
Figure 6E:
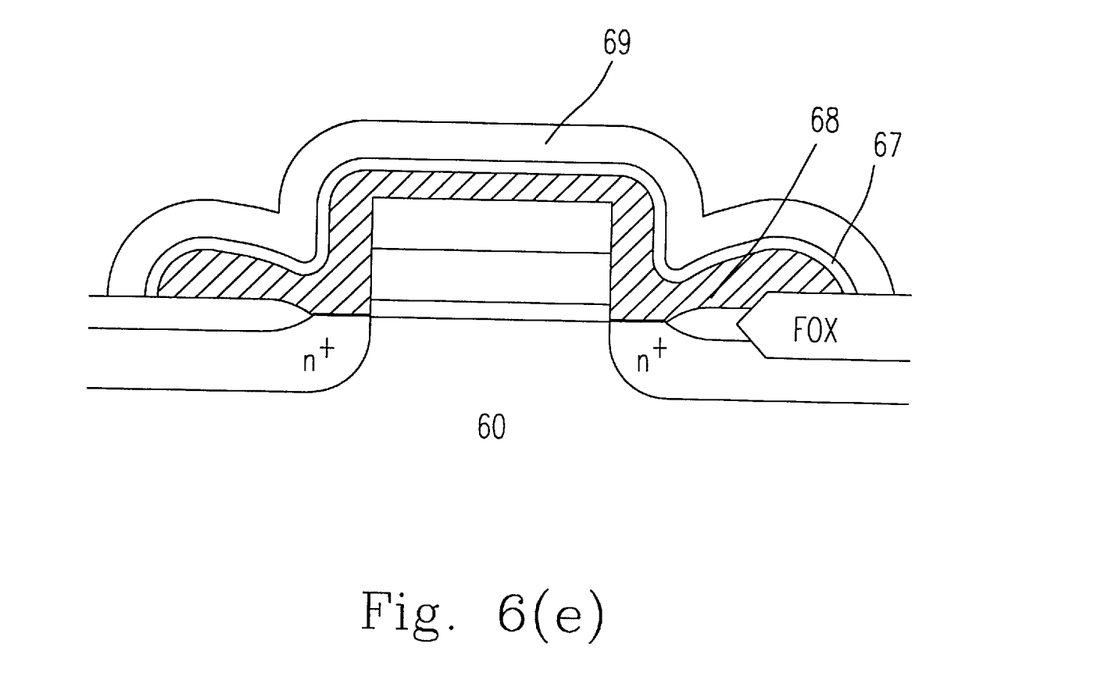

Please refer to FIG. 5 which is a circuit with four memories. Conventionally, the drain 44 and the source 46 are shared with neighboring nonvolatile memories and a whole nonvolatile memory can be used to program one data. Table 1 is an example of different operating voltages of W1 (word 1), W2 (word 2), D1 (drain 1), D2 (drain 2), S (source), and P-well to erase, program and read the memory 51. More than one memories are used to memorize the same data to ensure the reliability. However, in the present invention, another line is connected to the p-well to program the ONO layer separately. That is to say, we can program the same data in the ONO layer and the floating gate of one nonvolatile memory without two. We also can program different to the ONO layer and the floating gate data to achieve the purpose of multi-state memory. Table 2 is an example of different operating voltages to program or erase the ONO layer and the floating gate of the nonvolatile memory 51 with different data.

Please refer to FIG. 6 which is a process for producing a nonvolatile memory according to the present invention. As shown in FIG. 6(a), an oxide/nitride/oxide (ONO) layer is formed by the steps of forming a first oxide layer 61 on the substrate 60, forming a nitride layer 62 on the first oxide layer 61, and forming a second oxide layer 63 on the nitride layer 62. The thickness of the first oxide layer 61, the nitride layer 62, and the second oxide layer 63 are in the range of 20~60Å, 20~100Å, and 20~500Å respectively. Thereafter, the nitride spacer 64 is formed alongside the ONO layer 61, 62, 63 and then the substrate is doped by ion implantation to form the drain 71 and the source 72 as shown in FIG. 6(b). Thereafter, a wet oxide layer 65 is formed alongside the nitride spacer 64 to cover the exposure part of the drain 71 and source 72 as shown in FIG. 6(c). FIG. 6(d) schematically shows a figure of erasing the nitride spacer 64 and forming a tunneling oxide layer 66 which only has a thickness range from 80~150Å on the drain 71 and source 72 where the spacer 64 used to be. FIG. 6(e) schematically shows a figure of forming the floating gate 68, the dielectric layer 67 and the control gate 69 in sequence to cover the whole memory. The nonvolatile memory of the present invention is formed finally.

In the present invention, an oxide/nitride/oxide (ONO) layer is setting inside a FLOTOX memory. The ONO layer and the FLOTOX can be controlled separately by providing different voltages to achieve the purpose of multi-state memory. The ONO layer and the FLOTOX also can be program the same data to ensure the reliability with a small size.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

TABLE 1

| Operating voltage (V) | W1 | W2 | D1 | D2 | S | P-well |
|---|---|---|---|---|---|---|
| Erase 51 | 7 | 7 | −5 | −5 | −5 | −5 |
| Program 51 | −5 | 7 | 7 | 7 | 7 | 7 |
| Read 51 | 5 | 0 | S.A. | open | 0 | open |

TABLE 2

| Operating voltage (V) | W1 | W2 | D1 | D2 | S | P-well |
|---|---|---|---|---|---|---|
| (for O/N/O layer) | | | | | | |
| Erase 51 | 7 | 7 | −5 | −5 | −5 | −5 |
| Program 51 | −5 | 7 | open | open | open | 7 |
| (for FLOTOX) | | | | | | |
| Erase 51 | 7 | 7 | −5 | −5 | −5 | −5 |
| Program 51 | −5 | 7 | 7 | open | open | open |

What is claimed is:

1. A nonvolatile memory comprising:
   a substrate having a drain end and a source end therein;
   a tunneling oxide layer being a local thin oxide layer formed on said drain end;
   a memory unit that is a composite dielectric layer and formed on a portion of said substrate between said drain end and said source end;
   a floating gate directly formed on said memory unit and said tunneling oxide layer; and
   a control gate formed on said floating gate.

2. The nonvolatile memory according to claim 1 wherein said composite dielectric layer is an ONO (Oxide/Nitride/Oxide) layer.

3. The nonvolatile memory according to claim 2 wherein said ONO layer further comprises:
   a first oxide layer formed on said substrate;
   a nitride layer formed on said first oxide layer; and
   a second oxide layer formed on said nitride layer.

4. The nonvolatile memory according to claim 3 wherein said first oxide layer has a thickness range from 20 Å to 60 Å.

5. The nonvolatile memory according to claim 3 wherein said nitride layer has a thickness range from 20 Å to 100 Å.

6. The nonvolatile memory according to claim 3 wherein said second oxide layer has a thickness range from 20 Å to 500 Å.

7. The nonvolatile memory according to claim 2 wherein said ONO layer memorizes a digital data by injecting electrons therein.

8. The nonvolatile memory according to claim 7 wherein said ONO layer erases said memorized digital data by injecting holes therein.

9. The nonvolatile memory according to claim 1 further comprising a dielectric layer between said floating gate and said control gate.

10. The nonvolatile memory according to claim 1 wherein said substrate has a drain and a source.

11. The nonvolatile memory according to claim 10 wherein said substrate has a channel between said drain and said source.

12. The nonvolatile memory according to claim 11 wherein said memory unit is between said floating gate and said channel.

* * * * *